United States Patent [19]

Cathey et al.

[11] Patent Number: 5,001,085
[45] Date of Patent: Mar. 19, 1991

[54] PROCESS FOR CREATING A METAL ETCH MASK WHICH MAY BE UTILIZED FOR HALOGEN-PLASMA EXCAVATION OF DEEP TRENCHES

[75] Inventors: David A. Cathey; Trung T. Doan, both of Boise, Id.

[73] Assignee: Micron Technology, Inc., Boise, Id.

[21] Appl. No.: 554,630

[22] Filed: Jul. 17, 1990

[51] Int. Cl.⁵ .......................................... H01L 21/465
[52] U.S. Cl. ..................... 437/245; 437/225; 437/229; 437/65; 437/67; 148/DIG. 105
[58] Field of Search ............... 437/225, 245, 229; 148/DIG. 105

[56] References Cited

U.S. PATENT DOCUMENTS

| | | | |
|---|---|---|---|
| 4,578,859 | 4/1986 | Hause et al. | 437/34 |
| 4,584,027 | 4/1986 | Metz, Jr. et al. | 437/18 |
| 4,717,681 | 1/1988 | Curran | 437/126 |
| 4,826,564 | 5/1989 | Desilets et al. | 437/245 |
| 4,946,804 | 8/1990 | Pritchard et al. | 437/245 |
| 4,956,306 | 9/1990 | Fuller et al. | 148/DIG. 105 |

*Primary Examiner*—Brian E. Hearn
*Assistant Examiner*—Deborah Wortman
*Attorney, Agent, or Firm*—Angus C. Fox, III; Stanley N. Protigal

[57] ABSTRACT

A process for creating a metal etch mask from either cobalt, nickel, palladium, iron or copper which may be utilized for halogen-plasma excavation of deep trenches. The process begins by creating a thin isolation layer of either silicon nitride or silicon dioxide on top of the layer to be trenched. A thin layer of one of the metals selected from the aforementioned list of five is then created on top of the isolation layer. A layer of polysilicon is then blanket deposited on top of the refractory metal layer. Photoresist masking is then performed as though the photoresist were the actual pattern for the trench etch. Exposed portions of the polysilicon layer are then etched away with an anisotropic etch. Following a photoresist strip, the substrate and overlying layers are subjected to an elevated temperature step, which causes the polysilicon to react with the underlying metal layer to form metal silicide. In substrate regions where no polysilicon overlies the metal layer, no silicide is formed. Next, the metal silicide is removed with a wet etch. A metal mask remains that is essentially an exact image of the original photoresist mask. Trenches may be etched to any desired depth with virtually no consumption of the metal mask. Once the trench etch is complete, the metal etch mask may be stripped utilizing a wet etch reagent such as aqua regia.

5 Claims, 3 Drawing Sheets

PROCESS FOR CREATING A METAL ETCH MASK WHICH MAY BE UTILIZED FOR HALOGEN-PLASMA EXCAVATION OF DEEP TRENCHES

FIELD OF THE INVENTION

This invention relates to semiconductor process technology and, more specifically, to masking techniques used for plasma or reactive ion etches.

BACKGROUND OF THE INVENTION

Silicon dioxide has become the preferred hard-mask patterning material for plasma etching deep trenches in silicon. In a chemically-halogenated plasma (the standard environment for such etches), silicon dioxide has a reactivity (also termed "selectivity") approximately 1/40 to 1/10 that of silicon. In other words, the silicon dioxide mask is consumed during the etch at a rate of 1/40 to 1/10 the rate at which silicon is consumed. For a given mask thickness, mask selectivity effectively limits trench depth. At the high end of the selectivity range, it is necessary to alter the chemistry of the plasma with chemical species that tend to cause deposition of unwanted materials on the surfaces of the etch chamber. For example, the presence of oxygen radicals and ions, chemical species that enhance selectivity of silicon over oxide during a halogenated-plasma etch, react with silicon to form silicon dioxide that is deposited as a glass layer on etch chamber walls. Deposited materials represent a potential source of pollution that must be periodically removed from the chamber. In addition, since mask selectivity may also be etch-rate dependent, it may be necessary to perform a plasma etch at an inconveniently slow rate in order to achieve a desired trench depth with a mask of optimal maximum thickness. Furthermore, as silicon dioxide masking material is eroded during a plasma etch, it may be redeposited on trench sidewalls near the mouth of the trench, thus, further complicating the fabrication process. Finally, if MOS gates have been created prior to an anisotropic plasma trench etch, removal of a silicon dioxide patterning mask with an isotropic oxide etch subsequent to the trench etch may compromise the integrity of existing gate oxide. This is especially true at gate edges.

What is needed is a patterning mask material that is essentially impervious to halogenated-plasma etches, and that does not require exotic modification of a halogen plasma. Ideally, the mask could be removed with a chemical wet etch that would not etch existing circuitry components.

SUMMARY OF THE INVENTION

This invention provides a process for creating a patterning mask for deep trench plasma etches from certain metals which react with silicon at elevated temperatures to form a metal silicide, which have a melting point appreciably greater than 850° C. (the approximate temperature at which polycrystalline silicon is deposited), and which do not react with chlorine, fluorine, or bromine to form volatile compounds with boiling points below approximately 300° C. (a necessary criterium for a material to be immune to erosion during a halogenated-plasma etch). Cobalt, nickel, palladium, iron and copper possess these characteristics. The masking process begins by creating a thin isolation layer of either silicon nitride or silicon dioxide (preferably the latter due to the perforation defects common to a deposited nitride layer) on top of the layer to be etched (normally a silicon substrate). A thin layer of one of the metals selected from the aforementioned list of five is then created on top of the isolation layer using one of any number of blanket deposition techniques (e.g. sputtering, vapor deposition, etc.). A layer of polysilicon is then blanket deposited on top of the refractory metal layer. The thickness of the polysilicon layer must be at least sufficient to allow complete consumption of subjacent portions of the metal layer when silicide-forming temperatures are reached. Photoresist masking is then performed as though the photoresist were the actual pattern for the trench etch. Exposed portions of the polysilicon layer are then etched away, preferably with an anisotropic etch to protect the polysilicon layer from undercutting. Following a photoresist strip, the substrate and overlying layers are subjected to an elevated temperature step, which causes the polysilicon to react with subjacent portions of the underlying metal layer to form metal silicide. In substrate regions where no polysilicon overlies the metal layer, no silicide is formed. Next, the metal silicide is removed with a wet etch. A metal mask remains that is essentially an exact image of the original photoresist mask. The metal mask may then be utilized as an etch mask in a halogenated plasma etch chamber. Trenches may be etched to any desired depth with virtually no consumption of the metal mask. Once the trench etch is complete, the metal etch mask may be stripped utilizing a wet etch reagent such as aqua regia.

PREFERRED EMBODIMENT OF THE INVENTION

Figure 1:
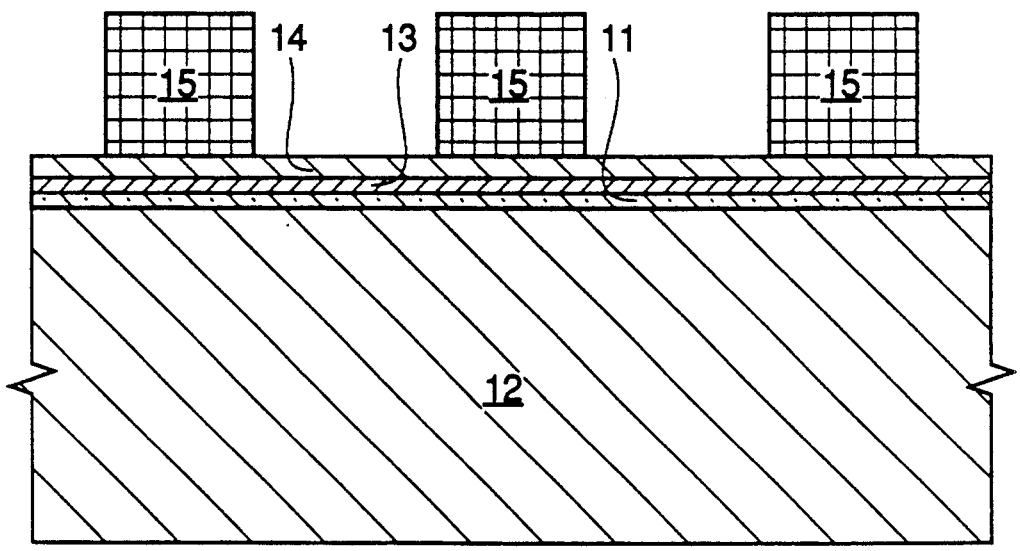
FIG. 1 is a cross-sectional view of an integrated circuit undergoing fabrication on a silicon wafer, showing a portion of the wafer substrate following thermal growth of a silicon dioxide isolation layer, deposition of a thin metal layer on top of the silicon dioxide layer, deposition of a polysilicon layer on top of the metal layer, and masking of the polysilicon layer with photoresist.

Referring now to FIG. 1, a silicon dioxide isolation layer 11 has been thermally grown on a silicon substrate 12 of an in-process wafer, following which a thin metal layer 13 has been deposited on top of isolation layer 11. The metallic element for metal layer 13 is selected from a group consisting of cobalt, nickel, palladium, iron and copper. A polysilicon layer 14 is then deposited on top of metal layer 13, following which polysilicon layer 14 is masked with a photoresist mask 15. Trenches will ultimately be etched on the substrate 12 that is not subjacent segments of photoresist mask 15.

Figure 2:
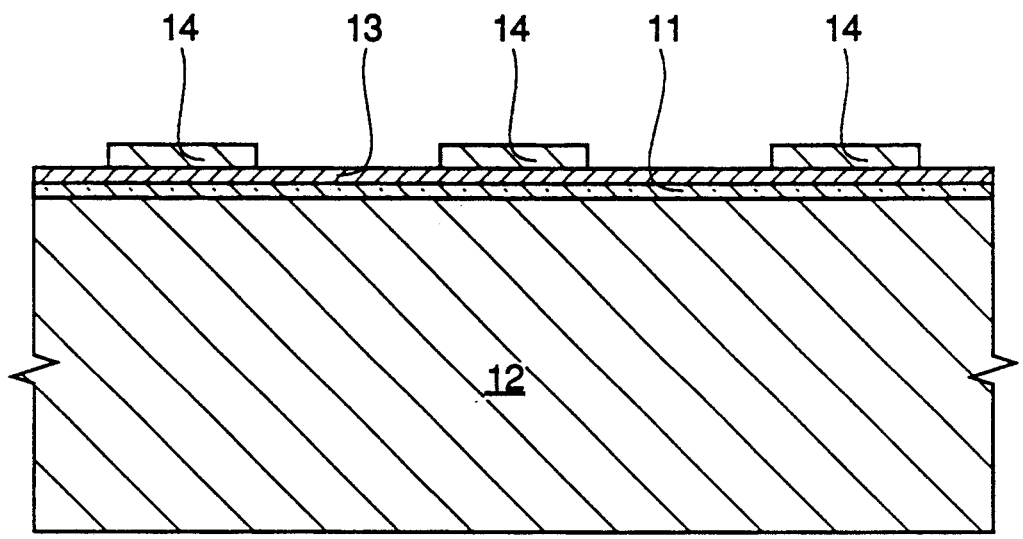
FIG. 2 is a cross-sectional view of the in-process wafer portion of FIG. 1 following an anisotropic polysilicon etch.

Referring now to FIG. 2, all portions of polysilicon layer 14 that were not protected by photoresist mask 15 have been etched away with an anisotropic etch that prevents undercutting of polysilicon beneath photoresist mask 15.

Figure 3:
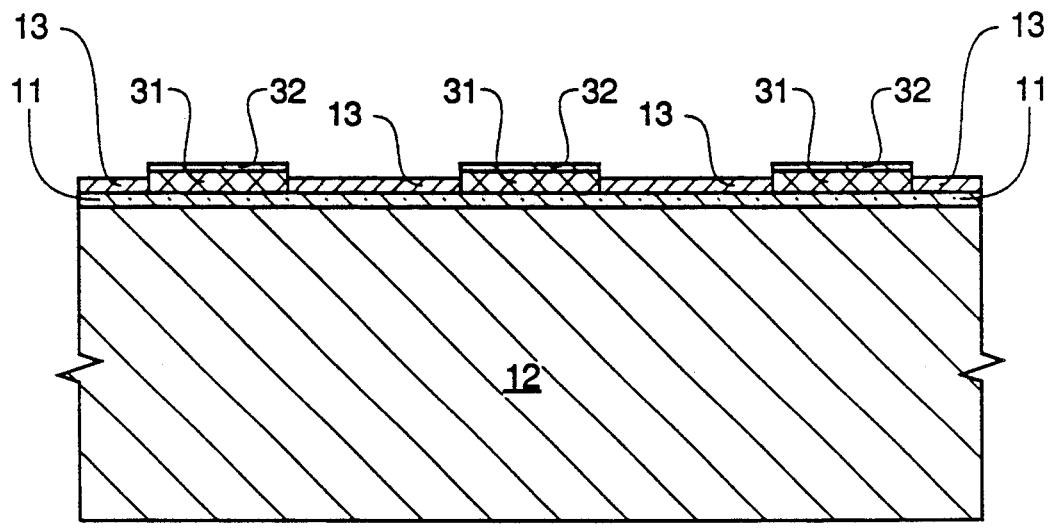
FIG. 3 is a cross-sectional view of the in-process wafer portion of FIG. 2 following an elevated temperature step which has caused the metal to react with overlying polysilicon to form metal silicide.

Referring now to FIG. 3, the in-process wafer has been subjected to an elevated temperature step which has caused the atoms of metal layer 13 to react with overlying polysilicon to form metal silicide regions 31. The atoms of those portions of metal layer 13 that were not subjacent unetched portions of polysilicon layer 14 have not been converted to metal silicide. A polysilicon layer remnant 32 remains on top of metal silicide region 31. The existence of polysilicon layer remnants 32 is required to ensure that all metal subjacent polysilicon is completely consumed during the silicidation process.

Figure 4:
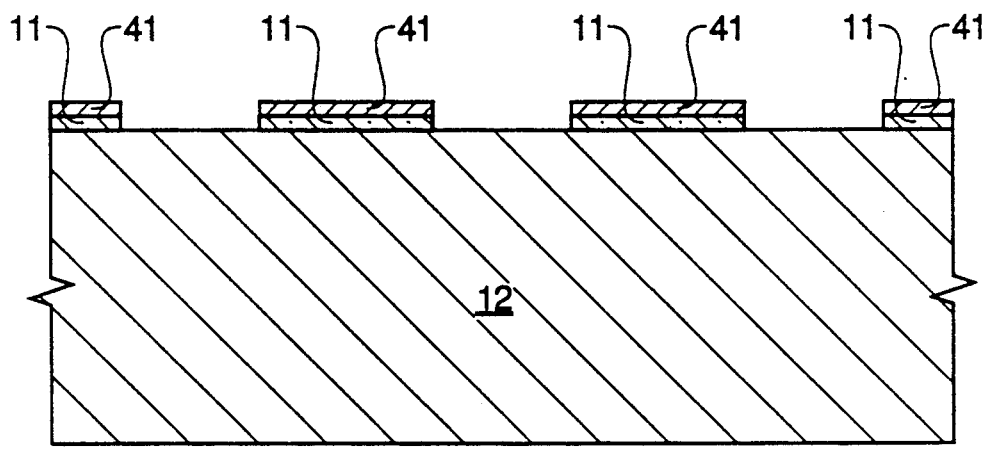
FIG. 4 is a cross-sectional view of the in-process wafer portion of FIG. 3 following a wet etch which selectively removes metal silicide and leaves unsilicided metal intact.

Referring now to FIG. 4, polysilicon layer remnants 32 and metal silicide regions 31 are removed with a wet etch that leaves unsilicided metal and the underlying silicon dioxide isolation layer 11 intact. The unsilicided metal now forms a halogen-plasma-resistant etch mask 41 that can be used to excavate deep trenches.

Figure 5:
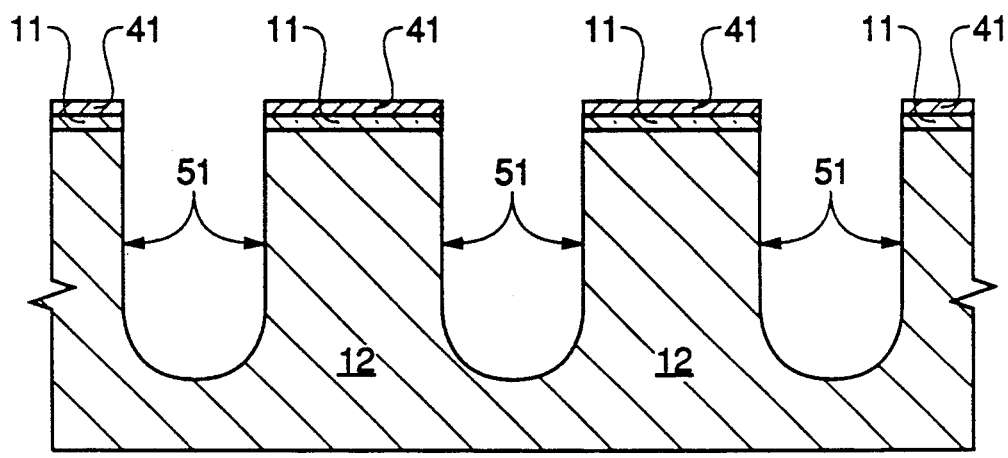
FIG. 5 is a cross-sectional view of the in-process wafer portion of FIG. 4 following an anisotropic silicon trench etch utilizing remnants of the metal layer as an etch mask.

Referring now to FIG. 5, the in-process wafer is subjected to a halogenated-plasma etch, which creates trenches 51. Etch mask 41 remains largely unaffected by the halogenated-plasma etch. The durability of etch mask 41 is no longer a factor in trench-depth limits.

Figure 6:
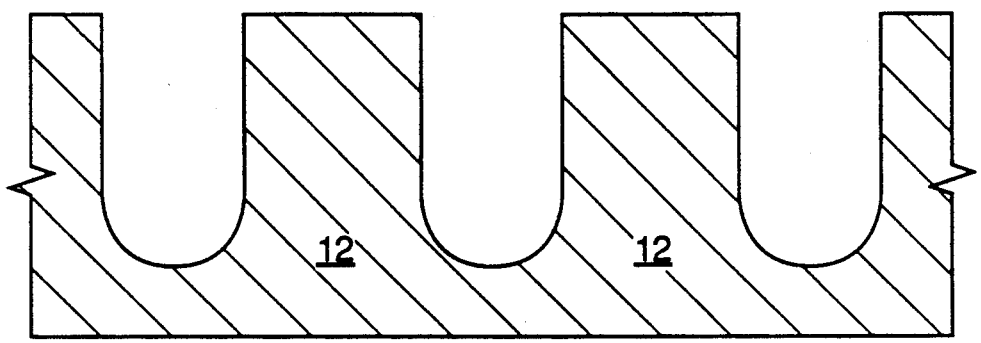
FIG. 6 is a cross-sectional view of the in-process wafer portion of FIG. 5 following the removal of the metal etch mask with aqua regia.

Referring now to FIG. 6, etch mask 41 has been removed from the substrate with a wet etch, using a mix of nitric and hydrochloric acids commonly known as aqua regia. Silicon dioxide isolation layer 11 is then removed with a wet oxide etch.

Although only a single embodiment of the process for creating a metal etch mask which may be utilized for halogen-plasma excavation of deep trenches has been disclosed, it will be apparent to those having ordinary skill in the art, that changes may be made thereto without departing from the spirit and the scope of the process as claimed.

We claim:

1. A process for creating a metal etch mask on an in-process wafer that will not erode in a halogenated-plasma etch environment, said process comprising the following sequence of steps:
   (a) creation of an isolation layer on top of the layer to be etched;
   (b) deposition of a metal layer on top of the isolation layer;
   (c) deposition of a polysilicon layer on top of the metal layer;
   (d) masking the polysilicon layer with a photoresist mask, said mask having the desired final masking pattern;
   (e) etching away those portions of the metal layer that are not covered by the photoresist mask;
   (f) stripping the photoresist mask;
   (g) subjecting the in-process wafer to a temperature sufficient to cause remaining portions of the polysilicon layer to react with portions of the metal layer that are in contact therewith to form patches of metal silicide;
   (h) removal of unreacted polysilicon;
   (i) removal of the metal silicide patches; and
   (j) removal of exposed remnants of the isolation layer with an anisotropic etch.

2. The process of claim 1 wherein said isolation layer is silicon dioxide.

3. The process of claim 1 wherein said isolation layer is silicon nitride.

4. The process of claim 1 wherein the metal for said metal layer is selected from a group consisting of cobalt, nickel, palladium, iron, and copper.

5. The process of claim 4 wherein said metal silicide patches are removed with an isotropic wet etch that is selective for the extent metal silicide over unsilicided remnants of the metal layer and over silicon dioxide.

* * * * *